US006566965B2

(12) United States Patent
Kamiya (10) Patent No.: US 6,566,965 B2
(45) Date of Patent: May 20, 2003

(54) PLL CIRCUIT INCLUDING A DC POWER SOURCE ALARM

(75) Inventor: Hiroshi Kamiya, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/973,026

(22) Filed: Oct. 10, 2001

(65) Prior Publication Data

US 2002/0041213 A1 Apr. 11, 2002

(30) Foreign Application Priority Data

Oct. 11, 2000 (JP) ........................................ 2000-311335

(51) Int. Cl.[7] ................................................ H03L 7/00
(52) U.S. Cl. ........................................ 331/1 A; 331/25
(58) Field of Search ................................ 331/1 A, 1 R, 331/8, 18, 25, DIG. 2; 327/156–159; 360/51; 375/376; 455/260

(56) References Cited

U.S. PATENT DOCUMENTS 4,120,229 A * 10/1978 Ota ............................. 84/454
4,509,201 A * 4/1985 Sekigawa et al. ........... 455/572
4,902,960 A * 2/1990 Lowenstein et al. ........ 324/621

FOREIGN PATENT DOCUMENTS

JP 57-59425 4/1982
JP 61-822 1/1986

* cited by examiner

*Primary Examiner*—David C. Mis
(74) *Attorney, Agent, or Firm*—McGinn & Gibb, PLLC (57) ABSTRACT

A PLL circuit comprises a circuit which issues an alarm when fluctuation of the potential of a DC power source connected to the PLL circuit exceeds a predefined range. A first potential generation circuit generates a first potential higher than a steady-state potential of the DC power source. A second potential generation circuit generates a second potential lower than the steady-state potential of the DC power source. A first comparator circuit compares a local maximum potential of the DC power source with the first potential. A second comparator circuit compares a local minimum potential of the DC power source with the second potential. A supply circuit supplies a drive voltage to an alarm issuer, in a case where the local maximum potential is higher than the first potential, and/or the local minimum potential is lower than the second potential, based on the comparison results.

20 Claims, 4 Drawing Sheets

PLL CIRCUIT INCLUDING A DC POWER SOURCE ALARM

BACKGROUND OF THE INVENTION

1. Field of the Invention

The present invention relates to a Phase Locked Loop circuit (PLL circuit).

2. Description of the Related Art

In some cases, the phase of a signal output from a PLL (Phase Locked Loop) circuit cannot be locked to a predetermined phase. One cause of this problem is that the electric potential (or voltage) of a direct-current power source (DC power source) for driving the PLL circuit fluctuates.

If the phase of the signal output from the PLL circuit cannot be fixed, the phase of a signal output from, for example, a clock driver employing the PLL circuit cannot be fixed, either. Since the above problem causes such malfunction of a device employing the PLL circuit, a technique for solving the above problem caused in the PLL circuit has been requested.

In Unexamined Japanese Patent Application KOKAI Publication No. S57-59425, a technique for preventing an alarm indicating circuit from malfunctioning, in a case where a voltage of a power source for the alarm indicating circuit suddenly changes, is disclosed. This technique prevents a signal for issuing an alarm from being supplied to the alarm indicating circuit, in a case where the voltage of the power source suddenly changes. Thus, the alarm indicating circuit does not work because no signal is supplied thereto, in the case where the voltage of the power source suddenly changes.

As described, since the alarm indicating circuit does not work in the case where the power source voltage suddenly changes according to the technique disclosed in Unexamined Japanese Patent Application KOKAI Publication No. S57-59425, the sudden change of the power source voltage (or electric potential) cannot be notified. Therefore, the above problem caused in the PLL circuit cannot be solved by the technique disclosed in this publication.

In Unexamined Japanese Patent Application KOKAI Publication No. S61-822, a circuit for issuing an alarm in a case where any fluctuation of a voltage of an alternating-current power source is detected, is disclosed. This circuit comprises a circuit for holding the peak of an alternating-current voltage, and a circuit for indicating an alarm in a case where the peak voltage is out of a predefined range. The circuit for indicating an alarm includes a micro processor.

The circuit disclosed in Unexamined Japanese Patent Application KOKAI Publication No. S61-822 can hold the peak of the alternating-current voltage, but cannot detect fluctuation of a voltage that is caused wherever other than at the peak. Therefore, it is inappropriate to use the circuit disclosed in this publication, for detecting fluctuation of an electric potential of, for example, a DC power source connected to the PLL circuit.

And since the circuit disclosed in Unexamined Japanese Patent Application KOKAI Publication No. S61-822 employs a micro processor as described above, the circuit becomes complicated, and costs too much.

The contents of Unexamined Japanese Patent Application KOKAI Publication No. S57-59425 and Unexamined Japanese Patent Application KOKAI Publication No. S61-822 are incorporated herein by reference.

SUMMARY OF THE INVENTION

Accordingly, it is an object of the present invention to provide a simply-structured and low-costing phase locked loop circuit which gives an alarm in a case where fluctuation of a potential of a direct-current power source is caused.

To accomplish the above object, a phase locked loop circuit of the present invention generates a second signal having a predetermined frequency and a predetermined phase based on a first signal supplied thereto, and comprises an alarm circuit which gives an alarm in a case where fluctuation of a potential of a direct-current power source which is connected to the phase locked loop circuit exceeds a predefined range.

According to this invention, a simply-structured and low-costing phase locked loop circuit which gives an alarm in a case where fluctuation of a potential of a direct-current power source is caused, can be provided.

The alarm circuit may comprise:

an alarm issuer which issues an alarm, by being supplied with a drive voltage; and a voltage supply circuit which supplies the drive voltage to the alarm issuer in a case where the fluctuation exceeds the predefined range.

The voltage supply circuit may comprise:

an alarm power source which supplies the drive voltage; and a control circuit which controls supply of the drive voltage from the alarm power source to the alarm issuer.

The control circuit may comprise:

a first potential generation circuit which generates a first potential which is higher than a steady-state potential of the direct-current power source;

a second potential generation circuit which generates a second potential which is lower than the steady-state potential of the direct-current power source;

a first comparator circuit which extracts a local maximum potential of a fluctuating potential of the direct-current power source, and compares the extracted local maximum potential with the first potential;

a second comparator circuit which extracts a local minimum potential of the fluctuating potential of the direct-current power source, and compares the extracted local minimum potential with the second potential; and a supply circuit which supplies the drive voltage to the alarm issuer based on a comparison result obtained by the first comparator circuit and a comparison result obtained by the second comparator circuit.

The supply circuit may supply the drive voltage to the alarm issuer, in a case where the local maximum potential is higher than the first potential, and/or the local minimum potential is lower than the second potential.

The first potential and the second potential may respectively be set, so that a range between the first potential and the second potential is defined within a range in which the phase locked loop circuit can lock a phase of the second signal to the predetermined phase.

The alarm issuer may comprise a light emitting diode, and issues an alarm by turning on the light emitting diode.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENTS

A Phase Locked Loop circuit (PLL circuit) according to a first embodiment of the present invention will now be explained below with reference to the drawings.

Figure 1:
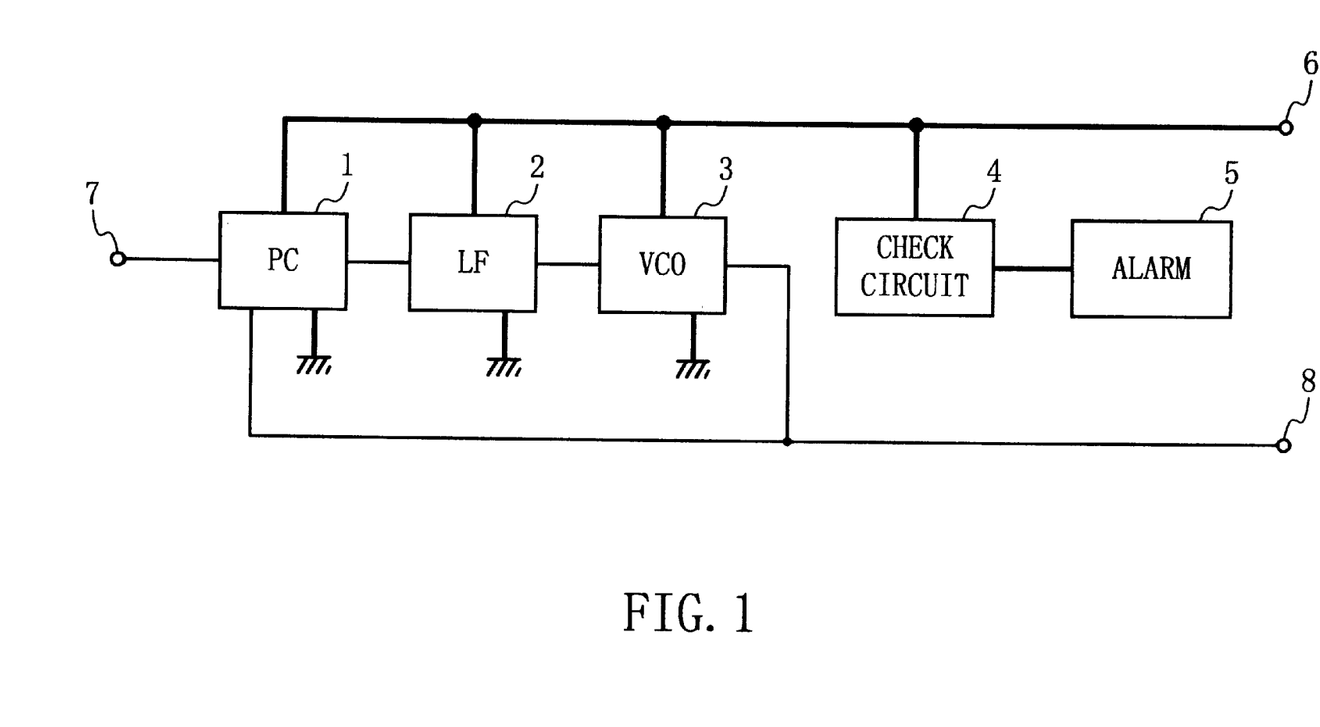
FIG. 1 is a block diagram of a Phase Locked Loop circuit (PLL circuit) according to a first embodiment.

The PLL circuit according to the first embodiment comprises a phase comparator (PC) 1, a loop filter (LF) 2, a voltage controlled oscillator (VCO) 3, a check circuit 4, and an alarm 5, as shown in FIG. 1.

The PLL circuit includes terminals 6, 7, and 8. An unillustrated DC power source (analog power source) for supplying a voltage for driving the PLL circuit is connected to the terminal 6. The voltage generated by the DC power source is supplied to the phase comparator 1, the loop filter 2, the voltage controlled oscillator 3, and the check circuit 4. An unillustrated reception circuit for receiving a first high frequency signal, an unillustrated generation circuit for generating the first high frequency signal, or the like is connected to the terminal 7. The first high frequency signal is supplied to the phase comparator 1 via the terminal 7. An unillustrated external circuit which uses a second high frequency signal generated by the PLL circuit based on the first high frequency signal is connected to the terminal 8.

In FIG. 1, wirings indicated by bold lines are wirings through which an electric current from the DC power source, or a voltage for driving the alarm 5 flows. Wirings indicated by normal lines are wirings through which a high frequency signal, or a direct-current signal (DC signal) derived from the high frequency signal flows. All wirings indicated in FIG. 2 (mentioned later) are wirings through which the electric current from the DC power source, or the drive voltage flows, thus indicated by normal lines.

The phase comparator 1 functions when it is grounded with being connected to the DC power source. The phase comparator 1 compares the first high frequency signal supplied via the terminal 7 and the second high frequency signal supplied from the voltage controlled oscillator 3. Then, the phase comparator 1 outputs a result signal representing the comparison result to the loop filter 2. Specifically, the phase comparator 1 outputs the result signal of a level corresponding to the difference between the phases of the compared signals to the loop filter 2.

The loop filter 2 functions when it is grounded with being connected to the DC power source. The loop filter 2 filters alternating-current elements out from the result signal supplied from the phase comparator 1. The result signal from which alternating-current elements are filtered is supplied as a direct-current signal (DC signal) to the voltage controlled oscillator 3.

The voltage controlled oscillator 3 functions when it is grounded with being connected to the DC power source. The voltage controlled oscillator 3 generates the second high frequency signal, and outputs the generated second high frequency signal to the phase comparator 1 and the terminal 8. At this time, the voltage controlled oscillator 3 alters the frequency of the second high frequency signal in accordance with the level of the DC signal supplied from the loop filter 2. In a case where a level of the DC signal is zero volt, the voltage controlled oscillator 3 outputs the second high frequency signal having a frequency (free running frequency) determined by resistance and capacity inside the voltage controlled oscillator 3. The DC signal having zero volt is supplied when the frequencies of the first high frequency signal and second high frequency signal are the same, and the difference between the phases of those signals is 90 degrees.

The check circuit 4 detects a noise included in a voltage from the DC power source, that is, it detects fluctuation of the electric potential of the DC power source. Then, the check circuit 4 supplies the drive voltage for driving the alarm 5 to the alarm 5, in a case where the detected fluctuation is larger than a predefined range. The detailed structure of the check circuit 4 will be described later.

The alarm 5 issues an alarm notifying that the fluctuation of the electric potential exceeds the predefined range, when it is supplied with the drive voltage from the check circuit 4. The alarm 5 has, for example, a light emitting diode, and issues an alarm by turning on the light emitting diode.

As described above, the result signal having a level corresponding to the difference between the phases of the first high frequency signal and second high frequency signal is supplied from the phase comparator 1 to the loop filter 2. Due to this, the DC signal having a level corresponding to the difference between the phases is supplied from the loop filter 2 to the voltage controlled oscillator 3. The voltage controlled oscillator 3 generates the second high frequency signal having a frequency corresponding to the level of the DC signal supplied thereto. Because of this, the frequency and phase of the second high frequency signal are adjusted to be the same as the frequency and phase of the first high frequency signal.

However, the voltage controlled oscillator 3 may not be able to adjust the phase of the second high frequency signal to be the same as the phase of the first high frequency signal, if the motion of the voltage controlled oscillator 3 is influenced by the fluctuation of the electric potential of the DC power source. Therefore, the check circuit 4 drives the alarm 5 in a case where the fluctuation of the electric potential is larger than a predefined range.

Figure 2:
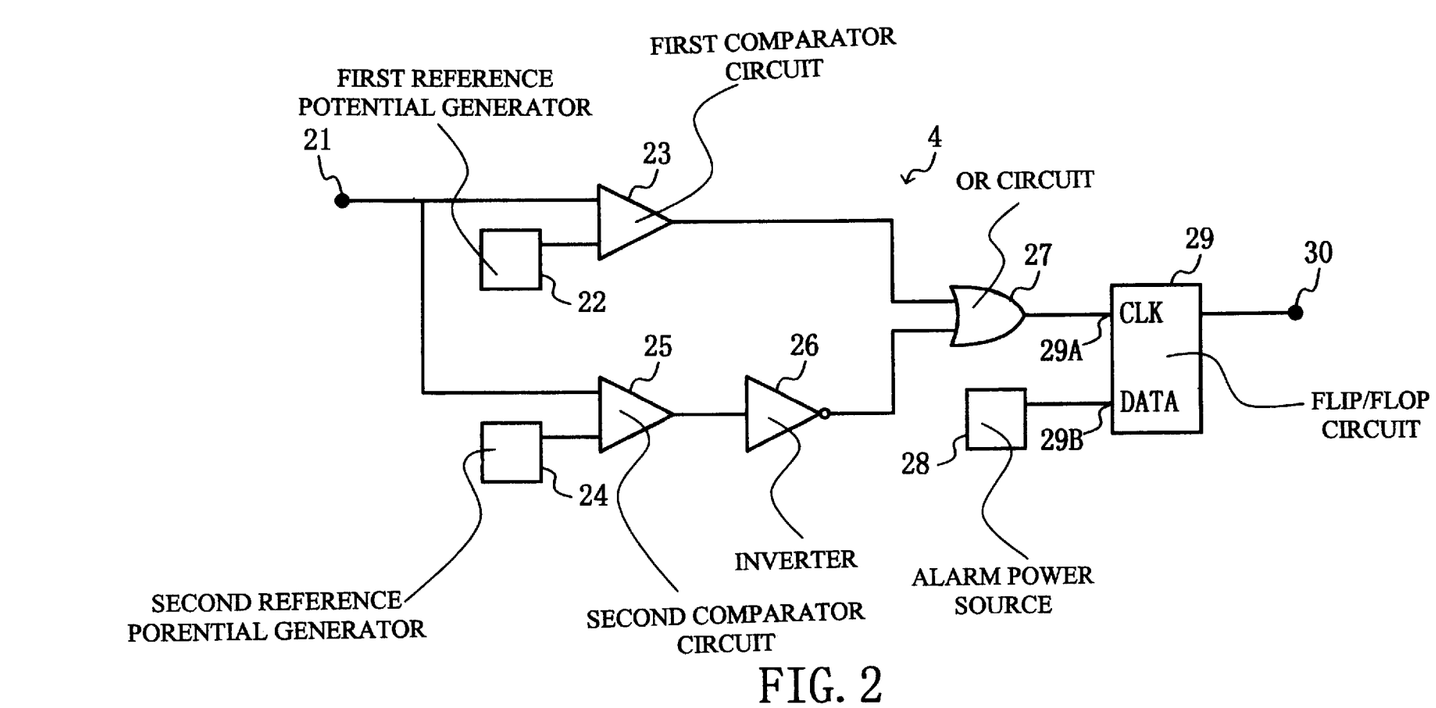
FIG. 2 is a block diagram of a check circuit included in the PLL circuit shown in FIG. 1.

The check circuit 4 comprises a power source pin 21, a first reference potential generator 22, a first comparator circuit 23, a second reference potential generator 24, a second comparator circuit 25, an inverter 26, an OR circuit 27, an alarm power source 28, a flip flop circuit (F/F circuit) 29, and an alarm pin 30.

The power source pin 21 is connected to the DC power source via the terminal 6. The voltage supplied by the DC power source is supplied to the first comparator circuit 23 and the second comparator circuit 25 via the power source pin 21.

The first reference potential generator 22 comprises a diode or the like. The first reference potential generator 22 generates a first reference potential which is higher than a steady-state potential of the DC power source, that is, higher than a potential of a case where no fluctuation is caused. The first reference potential may be set to any level, as long as the level is higher than the steady-state potential.

Figure 3:
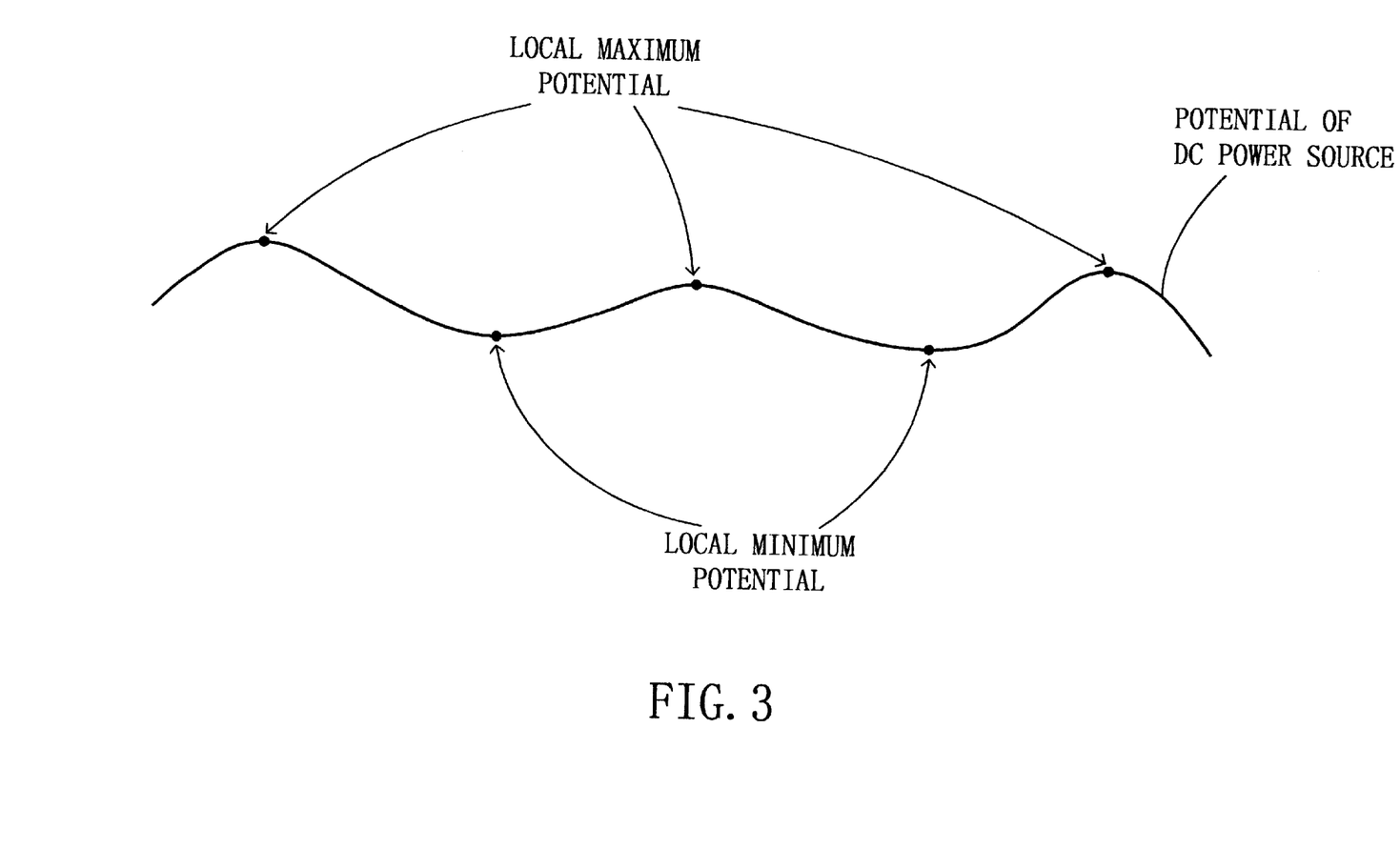
FIG. 3 is a diagram showing an example of a potential of a power source which is connected to the PLL circuit.

The first comparator circuit 23 comprises, for example, an integration circuit, and as shown in FIG. 3, extracts each local maximum potential of the DC power source. Then, the first comparator circuit 23 compares the extracted local maximum potential with the first reference potential generated by the first reference potential generator 22, and outputs a signal corresponding to the comparison result to the OR circuit 27. Specifically, the first comparator circuit 23 outputs a high-level signal in a case where the local maximum potential is higher than the first reference potential, and outputs a low-level signal in a case where the local maximum potential is equal to or lower than the first reference potential.

The second reference potential generator 24 comprises, for example, a diode. The second reference potential generator 24 generates a second reference potential which is lower than the steady-state potential of the DC power source. The second reference potential may be set to any level as long as the level is lower than the steady-state potential.

The second comparator circuit 25 comprises, for example, an integration circuit, and as shown in FIG. 3, extracts each local minimum potential of the DC power source. Then, the second comparator circuit 25 compares the extracted local minimum potential with the second reference potential generated by the second reference potential generator 24. The second comparator circuit 25 outputs a signal corresponding to the comparison result to the inverter 26. Specifically, the second comparator circuit 25 outputs a low-level signal in a case where the local minimum potential is lower than the second reference potential, and outputs a high-level signal in a case where the local minimum potential is equal to or higher than the second reference potential.

The inverter 26 reverses the level of the signal supplied from the second comparator circuit 25, and outputs the signal whose level is reversed to the OR circuit 27. Specifically, the inverter 26 outputs a low-level signal in a case where it is supplied with a high-level signal, and outputs a high-level signal in a case where it is supplied with a low-level signal.

The OR circuit 27 inputs a logical sum of the signal from the first comparator circuit 23 and the signal from the inverter 26 to a CLK input terminal 29A included in the flip flop circuit 29. Specifically, the OR circuit 27 inputs a low-level signal or a high-level signal to the CLK input terminal 29A.

The alarm power source 28 is a power source for driving the alarm 5 connected to the alarm pin 30. The alarm power source 28 supplies a voltage having a predetermined potential to a DATA input terminal 29B included in the flip flop circuit 29.

The flip flop circuit 29 supplies the voltage supplied to the DATA input terminal 29B to the alarm 5 via the alarm pin 30 as the drive voltage, when the signal input to the CLK input terminal 29A changes from the low level to the high level.

The operation of the PLL circuit according to the first embodiment will now be explained.

The unillustrated DC power source is connected to the terminal 6, the unillustrated reception circuit or generation circuit is connected to the terminal 7, and the unillustrated external circuit is connected to the terminal 8.

The phase comparator 1 compares the phase of the first high frequency signal supplied via the terminal 7 with the phase of the second high frequency signal supplied from the voltage controlled oscillator 3.

The phase comparator 1 outputs the result signal having a level corresponding to the difference between the phases to the loop filter 2.

The loop filter 2 filters out alternating-current elements from the supplied result signal, and supplies the result signal to the voltage controlled oscillator 3 as the DC signal.

The voltage controlled oscillator 3 generates the second high frequency signal having a frequency corresponding to the level of the supplied DC signal, and outputs it to the phase comparator 1.

By this operation, the frequency and phase of the second high frequency signal are locked to the frequency and phase of the first high frequency signal. The second high frequency signal is output to the external circuit via the terminal 8.

On the other hand, the check circuit 4 drives the alarm 5 in a manner described below, in a case where the fluctuation of the potential of the DC power source exceeds a predefined range.

The steady-state potential of the DC power source that does not fluctuate will be described as (VA), the first reference potential generated by the first reference potential generator 22 will be described as (VA+VP), and the second reference potential generated by the second reference potential generator 24 will be described as (VA−VM).

The first comparator circuit 23 of the check circuit 4 detects a local maximum potential of the DC power source, and compares it with the first reference potential (VA+VP). The second comparator circuit 25 detects a local minimum potential of the DC power source, and compares it with the second reference potential (VA−VM).

(1) In a case where the local maximum potential is equal to or lower than (VA+VP), and the local minimum potential is equal to or higher than (VA−VM)

The first comparator circuit 23 outputs a low-level signal to the OR circuit 27.

The second comparator circuit 25 outputs a high-level signal to the inverter 26. The inverter 26 inverts the supplied high-level signal to a low-level signal, and outputs it to the OR circuit 27.

The OR circuit 27 inputs the logical sum of the signal from the first comparator circuit 23 and the signal from the inverter 26 to the CLK input terminal 29A of the flip flop circuit 29. In this case, a low-level signal is input to the CLK input terminal 29A, and the flip flop circuit 29 does not supply the drive voltage supplied from the alarm power source 28 to the alarm 5. Therefore, the alarm 5 does not work.

(2) In a case where the local maximum potential is equal to or lower than (VA+VP), and the local minimum potential is lower than (VA−VM)

The first comparator circuit 23 outputs a low-level signal to the OR circuit 27.

The second comparator circuit 25 outputs a low-level signal to the inverter 26. The inverter 26 inverts the supplied low-level signal to a high-level signal, and supplies it to the OR circuit 27.

The OR circuit 27 inputs the logical sum of the signal from the first comparator circuit 23 and the signal from the inverter 26 to the CLK input terminal 29A of the flip flop circuit 29. In this case, a high-level signal is input to the CLK input terminal 29A. The flip flop circuit 29 supplies the drive voltage supplied from the alarm power source 28 to the alarm 5, in accordance with that the signal input to the CLK input terminal 29A changes from the low level to the high level. Due to this, the alarm 5 works to issue an alarm.

(3) In a case where the local maximum potential is higher than (VA+VP) and the local minimum potential is equal to or higher than the (VA−VM)

The first comparator circuit 23 outputs a high-level signal to the OR circuit 27.

The second comparator circuit 25 outputs a high-level signal to the inverter 26. The inverter 26 inverts the supplied high-level signal to a low-level signal, and outputs it to the OR circuit 27.

The OR circuit 27 inputs the logical sum of the signal from the first comparator circuit 23 and the signal from the inverter 26 to the CLK input terminal 29A of the flip flop circuit 29. In this case, a high-level signal is input to the CLK input terminal 29A. The flip flop circuit 29 supplies the drive voltage supplied from the alarm power source 28 to the alarm 5 in accordance with that the signal input to the CLK input terminal 29A is changed from the low level to the high level. Due to this, the alarm 5 works to issue an alarm.

(4) In a case where the local maximum potential is higher than (VA+VP), and the local minimum potential is lower than (VA−VM)

The first comparator circuit 23 outputs a high-level signal to the OR circuit 27.

The second comparator circuit 25 outputs a low-level signal to the inverter 26. The inverter 26 inverts the supplied low-level signal to a high-level signal, and supplies it to the OR circuit 27.

The OR circuit 27 inputs the logical sum of the signal from the first comparator circuit 23 and the signal from the inverter 26 to the CLK input terminal 29A of the flip flop circuit 29. In this case, the a high-level signal is input to the CLK input terminal 29A. The flip flop circuit 29 supplies the drive voltage supplied from the alarm power source 28 to the alarm 5 in accordance with that the signal input to the CLK input terminal 29A changes from the low level to the high level. Due to this, the alarm 5 works to issue an alarm.

As described, in a case where the local minimum potential of the DC power source is lower than (VA−VM), and/or the local maximum potential of the DC power source is higher than (VA+VP), the alarm 5 works. Therefore, in a case where the movement of the PLL circuit is influenced by the fluctuation of the potential, an alarm can be issued. However, the range between the first reference potential and the second reference potential must be set within a range in which the PLL circuit can properly function, that is, within a range in which the phase of the second high frequency signal can be locked. Due to this, the PLL circuit can be prevented from malfunctioning, and malfunction of the external circuit which uses the second high frequency signal can be avoided.

Only the check circuit 4 and the alarm 5 are necessary as the elements for avoiding malfunction. Therefore, a simply-structured and low-costing PLL circuit can be realized.

A PLL circuit according to a second embodiment of the present invention will now be explained below with reference to the drawings.

Figure 4:
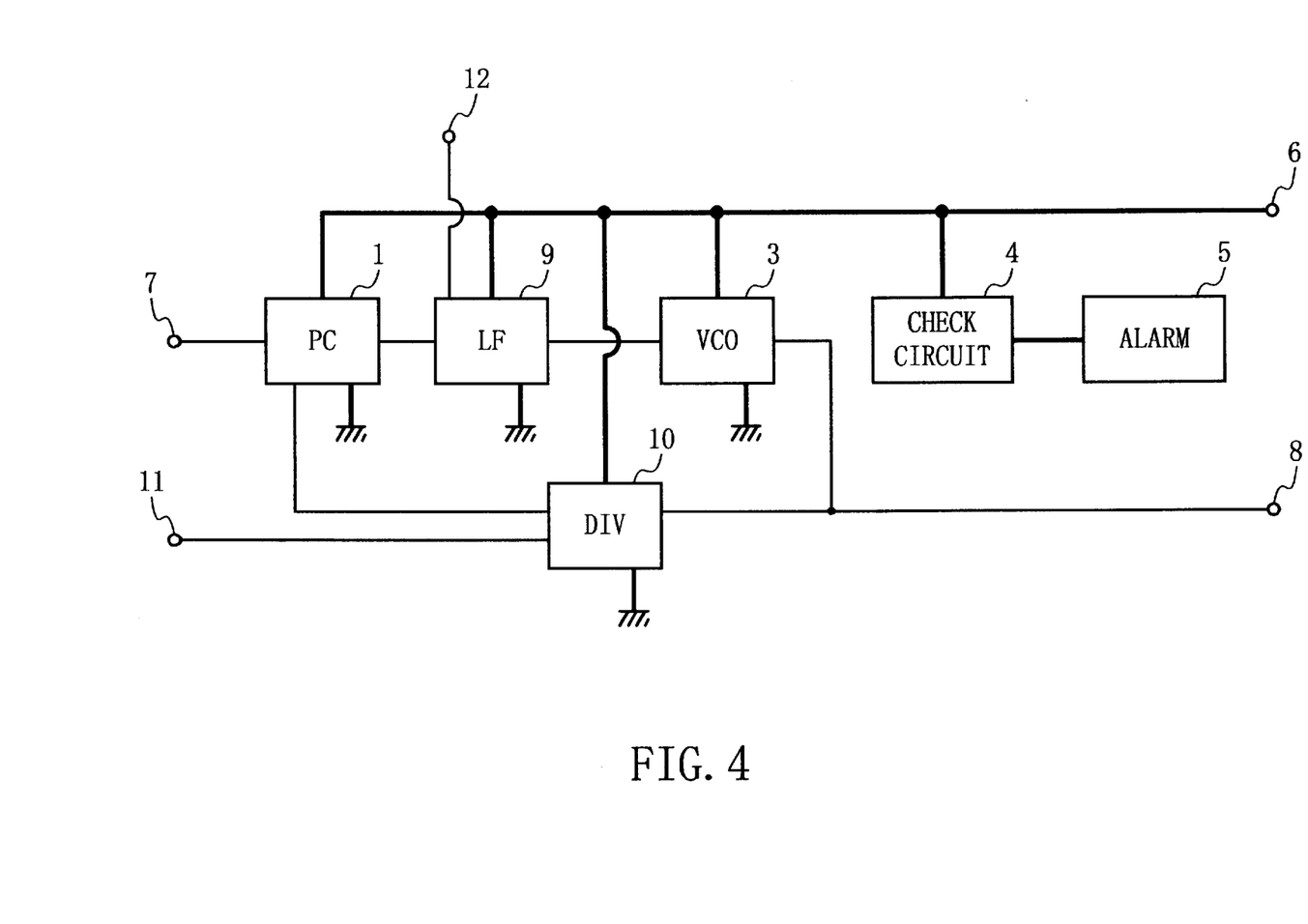
FIG. 4 is a block diagram of a PLL circuit according to a second embodiment.

The PLL circuit according to the second embodiment includes a loop filter 9 instead of the loop filter 2 of the PLL circuit according to the first embodiment, and additionally includes a variable divider (DIV) 10, as shown in FIG. 4.

In FIG. 4, wirings indicated by bold lines are wirings through which an electric current supplied from the DC power source, or the drive voltage flows. Wirings indicated by normal lines are wirings through which a high frequency signal or a DC signal derived from the high frequency signal flows.

The loop filter 9 is driven when it is grounded with being connected to the DC power source. The loop filter 9 has a terminal 12, and is supplied with a band switch signal from an unillustrated circuit connected to the terminal 12. The band switch signal is for switching the frequency band which determines a signal which goes through the loop filter 9. The loop filter 9 filters out alternating-current elements included in a result signal supplied from the phase comparator 1, and supplies the result signal to the voltage controlled oscillator 3 as a DC signal. At this time, the loop filter 9 selects the frequency band of the DC signal to be supplied to the voltage controlled oscillator 3 in accordance with the band switch signal supplied thereto. Thus, the DC signal whose frequency is within a predetermined frequency band is supplied to the voltage controlled oscillator 3.

The variable divider 10 is driven when it is grounded with being connected to the DC power source. The variable divider 10 has a terminal 11, and is supplied with a dividing value signal from an unillustrated circuit connected to the terminal 11. The dividing value signal represents a dividing value of the variable divider 10. The variable divider 10 divides the frequency of a second high frequency signal supplied from the voltage controlled oscillator 3 by the dividing value represented by the dividing value signal, and outputs the second high frequency signal whose frequency is divided to the phase comparator 1 as a third high frequency signal.

The phase comparator 1 compares the phase of a first high frequency signal with the phase of the third high frequency signal, and outputs the result signal having a level corresponding to the difference between the phases, in the same manner as that in the first embodiment.

The elements other than the loop filter 9 and the variable divider 10 are substantially the same as the elements shown in the first embodiment.

The operation of the PLL circuit according to the second embodiment will be explained.

The phase comparator 1 compares the phase of the first high frequency signal supplied via the terminal 7 with the phase of the third high frequency signal supplied from the variable divider 10, in the same manner as that of the first embodiment.

The phase comparator 1 outputs the result signal having a level corresponding to the difference between the phases to the loop filter 9.

The loop filter 9 filters alternating-current elements out from the result signal supplied from the phase comparator 1, and supplies the result signal as the DC signal to the voltage controlled oscillator 3. At this time, the loop filter 9 selects the frequency band of the DC signal in accordance with the band switch signal supplied via the terminal 12. Due to this, the DC signal having a frequency which is within a predetermined frequency band is supplied to the voltage controlled oscillator 3.

The voltage controlled oscillator 3 generates the second high frequency signal having a frequency corresponding to the level of the DC signal supplied from the loop filter 9, and outputs it to the variable divider 10.

The variable divider 10 divides the frequency of the second high frequency signal supplied from the voltage controlled oscillator 3 by the dividing value represented by the dividing value signal supplied via the terminal 11.

Then, the variable divider 10 outputs the second high frequency signal whose frequency has been divided to the phase comparator 1 as the third high frequency signal.

By the above-described operation, the frequency and phase of the third high frequency signal are adjusted to be the same as the frequency and phase of the first high frequency signal.

The frequency of the third high frequency signal can be changed by changing the dividing value of the variable divider 10. If the frequency of the third high frequency signal changes, the level of the DC signal supplied from the loop filter 9 to the voltage controlled oscillator 3 also changes. Due to this change, the frequency of the second high frequency signal to be output to the terminal 8 changes. Accordingly, the frequency of the second high frequency signal can be quickly switched by changing the dividing value of the variable divider 10 quickly.

On the other hand, the check circuit 4 drives the alarm 5, like it does in the first embodiment, in a case where the fluctuation of the potential of the DC power source exceeds a predetermined range. Due to this operation, the PLL circuit can be prevented from malfunctioning, and the external circuit which uses the second high frequency signal can also be prevented from malfunctioning.

Only the check circuit 4 and the alarm 5 are the required components for avoiding malfunction. Therefore, a PLL circuit which is simply structured and also low-costing can be realized.

In the second embodiment, an active loop filter may be used instead of the loop filter 9. With the use of an active loop filter, the frequency of the second high frequency signal to be supplied to the terminal 8 can be switched more quickly.

The PLL circuit according to the first embodiment may comprise two or more of the phase comparator 1, the loop filter 2, and the voltage controlled oscillator 3, respectively, to generate two or more high frequency signals. The PLL circuit according to the second embodiment may comprise two or more of the phase comparator 1, the loop filter 9, and the voltage controlled oscillator 3, respectively, to generate two or more high frequency signals. However, it should be noticed that the PLL circuit needs to include only one check circuit 4 and alarm 5, if only one DC power source is connected to the PLL circuit. In other words, the check circuit 4 and the alarm 5 may be provided to the PLL circuit in the same number as that of the DC power source.

Various embodiments and changes may be made thereunto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

This application is based on Japanese Patent Application No. 2000-311335 filed on Oct. 11, 2000, and including specification, claims, drawings and summary. The disclosure of the above Japanese Patent Application is incorporated herein by reference in its entirety.

What is claimed is:

1. A phase locked loop circuit which generates a second signal having a predetermined frequency and a predetermined phase based on a first signal supplied thereto, and comprises an alarm circuit which gives an alarm in a case where a fluctuation of a potential of a direct-current power source which is connected to said phase locked loop circuit exceeds a predefined range, wherein said alarm circuit comprises an alarm issuer that issues an alarm in response to a drive voltage.

2. The phase locked loop circuit according to claim 1, wherein said alarm circuit further comprises a voltage supply circuit which supplies the drive voltage to said alarm issuer in a case where said fluctuation exceeds the predefined range.

3. The phase locked loop circuit according to claim 2, wherein said voltage supply circuit comprises:

an alarm power source which supplies the drive voltage; and a control circuit which controls supply of the drive voltage from said alarm power source to said alarm issuer.

4. The phase locked loop circuit according to claim 3, wherein:

said control circuit comprises:

a first potential generation circuit which generates a first potential which is higher than a steady-state potential of said direct-current power source;

a second potential generation circuit which generates a second potential which is lower than the steady-state potential of said direct-current power source;

a first comparator circuit which extracts a local maximum potential of a fluctuating potential of said direct-current power source, and compares the extracted local maximum potential with the first potential;

a second comparator circuit which extracts a local minimum potential of the fluctuating potential of said direct-current power source, and compares the extracted local minimum potential with the second potential; and a supply circuit which supplies the drive voltage to said alarm issuer based on a comparison result obtained by said fist comparator circuit and a comparison result obtained by said second comparator circuit, wherein said supply circuit supplies the drive voltage to said alarm issuer, in a case where the local maximum potential is higher than the first potential, and/or the local minimum potential is lower than the second potential.

5. The phase locked loop circuit according to claim 4, wherein the first potential and the second potential are respectively set, so that a range between the first potential and the second potential is defined within a range in which said phase locked loop circuit can lock a phase of the second signal to the predetermined phase.

6. The phase locked loop circuit according to claim 5, wherein said alarm issuer comprises a light emitting diode, and issues an alarm by turning on said light emitting diode.

7. A phase locked loop circuit comprising an alarm circuit which comprises an alarm issuer that issues an alarm in response to being supplied with a drive voltage which indicates that a potential of a direct-current power source connected to said phase locked loop circuit exceeds a predetermined range.

8. The circuit of claim 7, wherein said alarm circuit further comprises a voltage supply circuit that is responsive to said potential exceeding said predetermined range to provide said drive voltage to said alarm issuer.

9. The circuit of claim 8, wherein said voltage supply circuit comprises an alarm power source that supplies said drive voltage.

10. The circuit of claim 9, wherein said voltage supply circuit further comprises a control circuit which controls supply of said drive voltage from said alarm power source.

11. The circuit of claim 10, wherein said control circuit comprises a first potential generator that generates a first potential which is higher than a desired steady-state potential of said direct current power source.

12. The circuit of claim 11, wherein said first potential is determined based upon a potential from said direct current power source above which said phase locked loop circuit will not lock a phase.

13. The circuit of claim 11, wherein said control circuit further comprises a first comparator which compares a local maximum potential of said direct-current power source with said first potential to generate a first comparison result.

14. The circuit of claim 13, wherein said control circuit further comprises a supply circuit which supplies said drive voltage to said alarm issuer in response to said first comparison result indicating that said local maximum potential exceeds said first potential.

15. The circuit of claim 10, wherein said control circuit comprises a second potential generator that generates a second potential which is lower than a desired steady-state potential of said direct current power source.

16. The circuit of claim 15, wherein said second potential is determined based upon a potential from said direct current power source below which said phase locked loop circuit will not lock a phase.

17. The circuit of claim 15, wherein said control circuit further comprises a second comparator which compares a local maximum potential of said direct-current power source with said second potential to generate a second comparison result.

18. The circuit of claim 17, wherein said control circuit further comprises a supply circuit which supplies said drive voltage to said alarm issuer in response to said second comparison result indicating that said local maximum potential is less than said second potential.

19. The circuit of claim 7, wherein said alarm issuer comprises a light emitting diode.

20. The circuit of claim 19, wherein said alarm issuer issues said alarm by providing said drive voltage to said light emitting diode to turn on said light emitting diode.

* * * * *